US008270153B2

(12) United States Patent
Song et al.

(10) Patent No.: US 8,270,153 B2
(45) Date of Patent: Sep. 18, 2012

(54) CONNECTOR

(75) Inventors: Yong-Jun Song, Shenzhen (CN); Chun-Fang Xi, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/082,376

(22) Filed: Apr. 7, 2011

(65) Prior Publication Data

US 2012/0190231 A1 Jul. 26, 2012

(30) Foreign Application Priority Data

Jan. 20, 2011 (CN) .......................... 2011 1 0022776

(51) Int. Cl.
*H05K 7/00* (2006.01)

(52) U.S. Cl. .................................................. 361/679.42

(58) Field of Classification Search .................. 439/310, 439/374, 152–159; 361/679.42, 679.38, 361/679.39; 235/476, 479
See application file for complete search history.

(56) References Cited

U.S. PATENT DOCUMENTS

| | | | | | |
|---|---|---|---|---|---|
| 4,352,492 | A | * | 10/1982 | Smith | 463/44 |
| 5,146,069 | A | * | 9/1992 | Orimoto et al. | 235/475 |
| 5,648,651 | A | * | 7/1997 | Inoue | 235/475 |
| 5,879,175 | A | * | 3/1999 | Muramatsu et al. | 439/159 |
| 2005/0218227 | A1 | * | 10/2005 | Takita et al. | 235/441 |
| 2009/0190142 | A1 | * | 7/2009 | Taylor et al. | 358/1.1 |

* cited by examiner

*Primary Examiner* — Phuong Dinh
(74) *Attorney, Agent, or Firm* — Altis Law Group, Inc.

(57) ABSTRACT

A connector includes a holder, a transfer device received in the holder, a sensing device set in the transfer device, and a peripheral interface attached to the holder to be connected to a peripheral device. The sensing device senses whether the peripheral device enters the transfer device. When the peripheral device enters the transfer device, the transfer device drives the peripheral device to move to be plugged into the peripheral interface.

8 Claims, 3 Drawing Sheets

CONNECTOR

BACKGROUND

1. Technical Field

The present disclosure relates to a connector.

2. Description of Related Art

With the development of electronic technology, more and more electronic connectors are needed to communicate between electronic devices. Some electronic connectors, such as audio connectors, have a centrosymmetrical structure, and the others, such as universal serial bus (USB) connectors, have a non-centrosymmetrical structure. In use, a user has to find out obverse and reverse of the non-centrosymmetrical connector at first at the first time. If the user makes a mistake, the non-centrosymmetrical electronic connector can be easily damaged.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to “an” or “one” embodiment in this disclosure are not necessarily to the same embodiment, and such references mean at least one.

Figure 1:
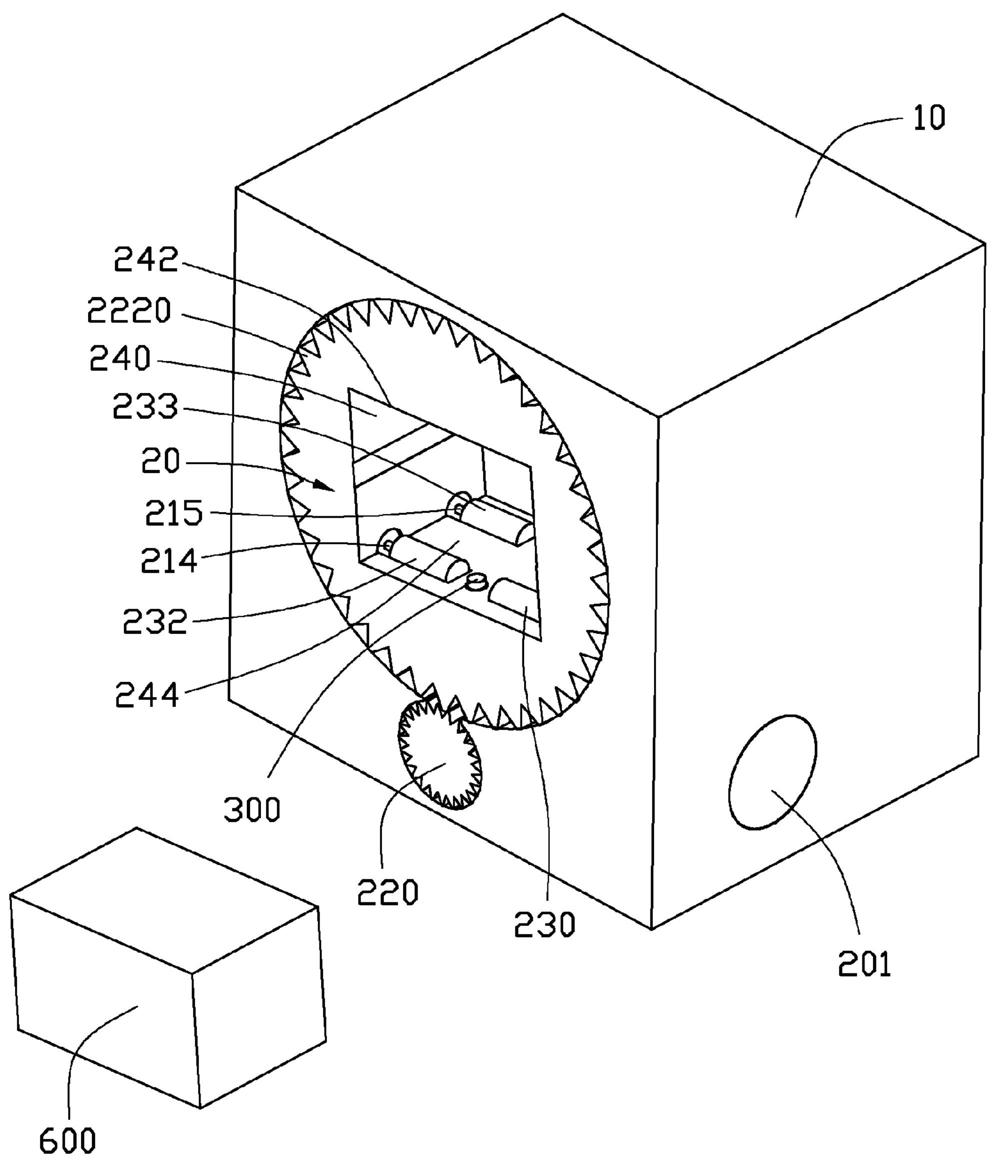
FIG. 1 is an assembled, isometric view of an exemplary embodiment of a connector, together with a peripheral USB device.
Figure 2:
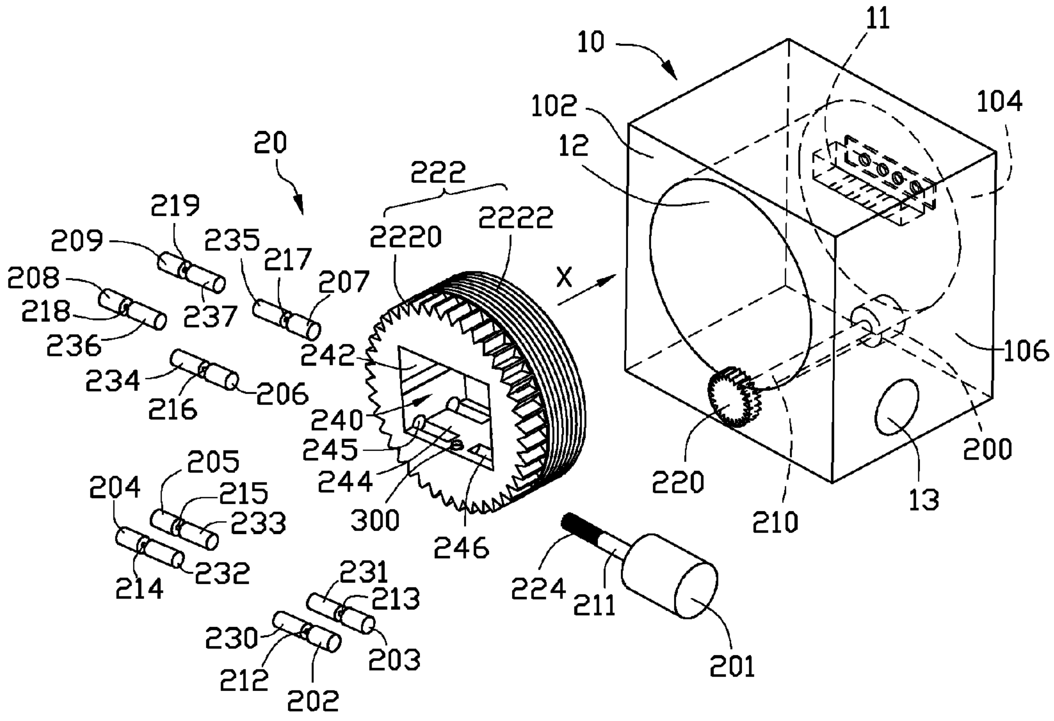
FIG. 2 is an exploded, isometric view of the connector of FIG. 1.
Figure 3:
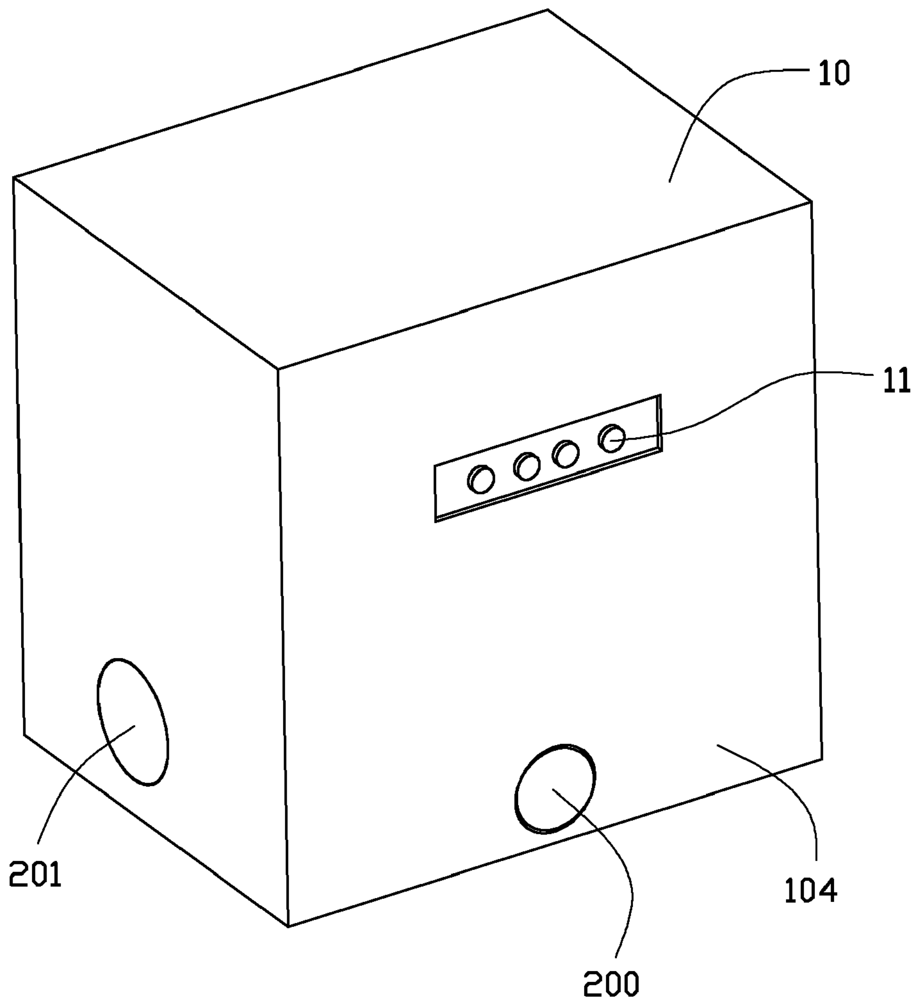
FIG. 3 is an assembled, isometric view of FIG. 1, but shown from another perspective.

Referring to FIGS. 1 to 3, an exemplary embodiment of a connector includes a holder 10, a transfer device 20, a sensing device 300, and a peripheral interface 11. In this embodiment, the peripheral interface 11 is a universal serial bus (USB) interface. In other embodiments, the peripheral interface 11 can be another type of interface, such as a high definition multimedia interface or an audio interface.

The holder 10 is substantially rectangular and includes a first side surface 102, a second side surface 104 opposite to the first side surface 102, and a third side surface 106 perpendicularly connected between the first and second side surfaces 102 and 104. The holder 10 defines a cylindrical first receiving hole 12 through the first side surface 102, and a cylindrical second receiving hole 13 through the third side surface 106. The peripheral interface 11 is received in the first receiving hole 12 and exposed through the second side surface 104. A first gear 220 is rotatably mounted to the holder 10, below the first receiving hole 12 and is partially exposed through the first side surface 102, and some of the teeth of the first gear 220 extending into the first receiving hole 12.

The transfer device 20 includes ten motors 200-209, ten shafts 210-219, second and third gears 222 and 224, eight wheels 230-237, and a controlling circuit (not shown). First ends of the shafts 210-219 are respectively connected to the corresponding motors 200-209. Second ends of each of the shafts 210 and 211 opposite to the first end are respectively connected to the first and third gears 220 and 224. Second ends of the shafts 212-219 opposite to the first ends are respectively connected to the corresponding wheels 230-237. A first end of a circumference of the second gear 222 axially forms teeth 2220, and a second end of the circumference of the second gear 222 radially forms teeth 2222. The teeth of the first gear 220 meshes with the teeth 2220 of the second gear 220. The third gear 224 meshes with the teeth 2222. The second gear 222 axially defines a rectangular through hole 240 in the center. Two opposite first inner surfaces 242 and two second inner surfaces 244 together bound the through hole 240. Each second inner surface 244 defines four slots 246. Four receiving slots 245 are defined in the second gear 222, through each first inner surface 242 to communicate with the corresponding slots 246. The motors 202-209 are received in the receiving slots 245, and the wheels 230-237 are respectively received in the corresponding slots 246.

The second gear 222 is received in the first receiving hole 12. The shaft 210 is perpendicular to the shaft 211. The motor 201 is received in the second receiving hole 13 of the holder 10, and the third gear 224 partially extends into the first receiving hole 12 of the holder 10 to mesh with the teeth 2222 of the second gear 222. Thus, when the first gear 220 is driven to rotate, the first gear 220 drives the second gear 222 to rotate and when the third gear 224 is driven to rotate, the third gear 224 drives the second gear 222 to axially move, which is X direction as shown in FIG. 2.

The sensing device 300 includes two infrared sensors respectively set on the second inner surfaces 244 aligned with each other.

When a peripheral USB device 600 is received in the through hole 240, the sensing devices 300 are shielded from each other. Thus the sensing device 300 senses the peripheral USB device 600 received in the through hole 240, and sends a sensing signal to the controlling circuit. The controlling circuit controls the motors 202-205 to rotate counter-clockwise and controls the motors 206-209 to rotate clockwise, thereby making the wheels 230-237 drive the peripheral USB device 600 to move along the X direction. When the number of rotations of the motors 202-209 reach a determined value, the peripheral USB device 600 contacts the peripheral interface 11. The controlling circuit then controls the motor 201 to rotate clockwise.

The motor 201 rotates clockwise and drives the second gear 222 and the peripheral USB device 600 to move along the X direction to plug the peripheral USB device 600 into the peripheral interface 11. If the peripheral USB device 600 and the peripheral interface 11 do not align with each other, the peripheral USB device 600 cannot be plugged into the peripheral interface 11. The controlling circuit controls the motor 200 to rotate clockwise or counter-clockwise to drive the second gear 222 to rotate 180 degrees. The motor 200 then stops, and the controlling circuit controls the motor 201 to rotate clockwise. Because of the peripheral USB device 600 and the peripheral interface 11 are aligned with each other, the peripheral USB device 600 is plugged into the peripheral interface 11.

When the peripheral USB device 600 needs to be disassembled from the peripheral interface 11, the controlling circuit controls the motor 201 to rotate counter-clockwise to reach a determined value to separate the peripheral USB device 600 from the peripheral interface 11. After that, the controlling circuit controls the motor 202-205 to rotate clockwise and controls the motor 206-209 to rotate counter-clockwise, thereby driving the peripheral USB device 600 to move long a direction opposite to the X direction. When the peripheral USB device 600 is separated from the holder 10, the sensing devices 300 sense each other to turn off the controlling circuit.

In other embodiments, the sensing devices 300 are two pressure sensors.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

The invention claimed is:

1. A connector comprising:

a holder;

a transfer device received in the holder;

a sensing device set in the transfer device; and a peripheral interface attached to the holder, to be connected to a peripheral device;

wherein the sensing device senses whether the peripheral device enters the transfer device, when the peripheral device enters the transfer device, the transfer device drives the peripheral device to move to be plugged into the peripheral interface; and wherein the transfer device comprises a first motor, a second motor, a first shaft, a second shaft perpendicular to the first shaft, a first gear, a second gear, and a third gear, first ends of the first and second shafts are connected to the first and second motors, second ends of the first and second shafts are connected to the first gear and the third gear, a first end of a circumference of the second gear axially forms first teeth meshing with the first gear, a second end of the circumference of the second gear radially forms second teeth meshing with the third gear.

2. The connector of claim 1, wherein the second gear axially defines a through hole for the peripheral device to extend through.

3. The connector of claim 2, wherein the sensing device comprises two infrared sensors respectively set on two opposite inner surfaces of the through hole, the infrared sensors align with each other, when the infrared sensors are shielded from each other, the sensing device determines that the peripheral device enters the through hole.

4. The connector of claim 2, wherein the sensing device comprises two pressure sensors respectively set on two inner surfaces of the through hole, the infrared sensors align with each other, when the pressure sensors are shielded from each other, the sensing device determines that the peripheral device enters the through hole.

5. The connector of claim 2, wherein the transfer device further comprises a first to an eighth wheels, a third to a tenth shafts, and a third to a tenth motors, first ends of the third to the tenth shafts are connected to the thirds to the tenth motors, second ends of the third to the tenth shafts are connected to the first to the eighth wheels, the third to the tenth motors are set in two opposite first inner surfaces bound the through hole, and the first to the eighth wheels are set in two opposite second inner surfaces bound the through hole.

6. The connector of claim 5, wherein the first inner surfaces each define four receiving slots, the third to tenth motors are received in receiving slots, respectively.

7. The connector of claim 5, wherein the second inner surfaces each define four slots, the first to eighth wheels each are partially received in slots, respectively.

8. The connector of claim 1, wherein the peripheral interface is a universal serial bus (USB) interface.

* * * * *